(12) United States Patent
Levitan et al.

(10) Patent No.: US 6,465,929 B1
(45) Date of Patent: Oct. 15, 2002

(54) MICROELECTROMECHANICAL SYSTEM ACTUATOR FOR EXTENDED LINEAR MOTION

(75) Inventors: Jeremy A. Levitan, Cambridge, MA (US); Michael J. Sinclair, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/545,557

(22) Filed: Apr. 7, 2000

(51) Int. Cl.[7] ............................................. H02N 1/00
(52) U.S. Cl. ...................................................... 310/309
(58) Field of Search ........................ 310/12, 308, 310, 310/300, 83, 40 MM, 309

(56) References Cited

U.S. PATENT DOCUMENTS 5,959,376 A * 9/1999 Allen .................... 310/40 MM
6,069,419 A * 5/2000 Tabib-Azar ............ 310/40 MM
6,133,670 A * 10/2000 Rodgers et al. ............. 310/309

* cited by examiner

Primary Examiner—Nestor Ramirez
Assistant Examiner—Guillermo Perez
(74) Attorney, Agent, or Firm—Ipsolon LLP

(57) ABSTRACT

A microelectrical mechanical systems actuator that provides a long throw is disclosed. The actuator includes a drive mechanism that oscillates a pallet that is located between leg portions of a drive member. The pallet includes first and second rows of pallet teeth located along two opposite edges of the pallet. The drive member is slideably coupled to a substrate, and includes first and second rows of drive teeth that are located along two opposing drive margins of the drive member leg portions. The pallet teeth and the drive teeth are compatible so as to permit meshing engagement of the pallet teeth with the drive teeth. The pallet is arranged between the rows of drive teeth. When the pallet teeth are meshingly misaligned with respective drive teeth and the pallet is urged against the drive margin, the drive member is forced to move until the teeth meshingly engage. By arranging the pallet and drive teeth so that first and second respective sets of pallet and drive teeth can not simultaneously be in meshing alignment, the drive member may be incrementally moved by oscillating the pallet edges between the first and second drive margins. The shape of the pallet and drive teeth may be selected to control a step size of the movement increment and the force applied. Further, the pallet and drive teeth may be arranged so as to provide movement in one direction or two directions.

38 Claims, 5 Drawing Sheets

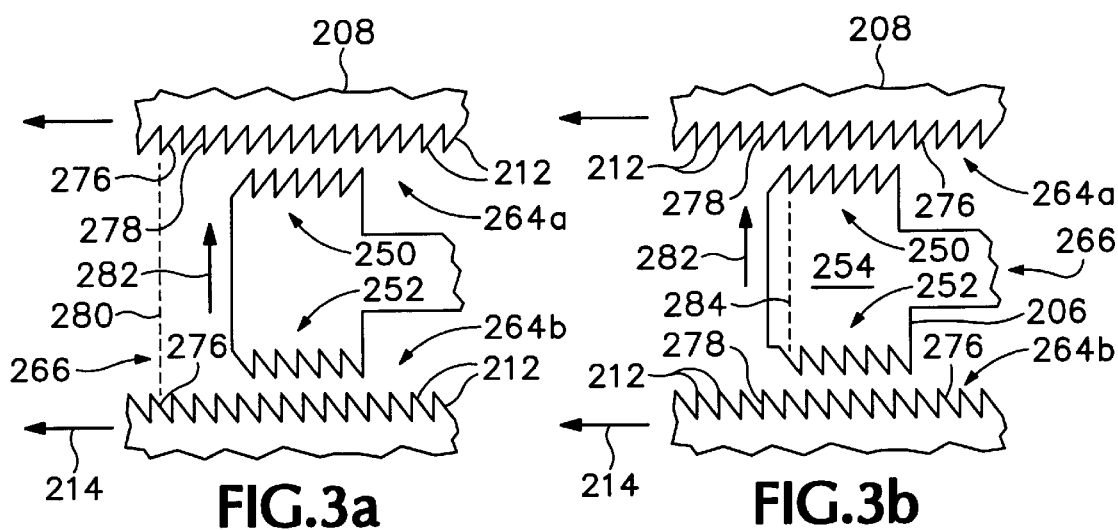
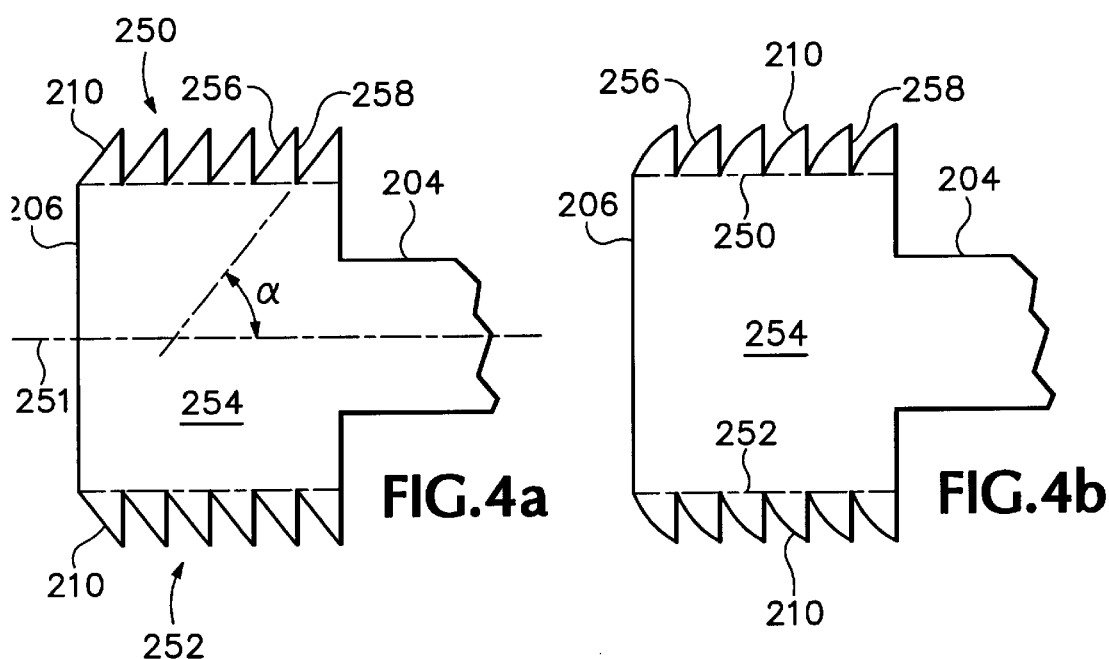

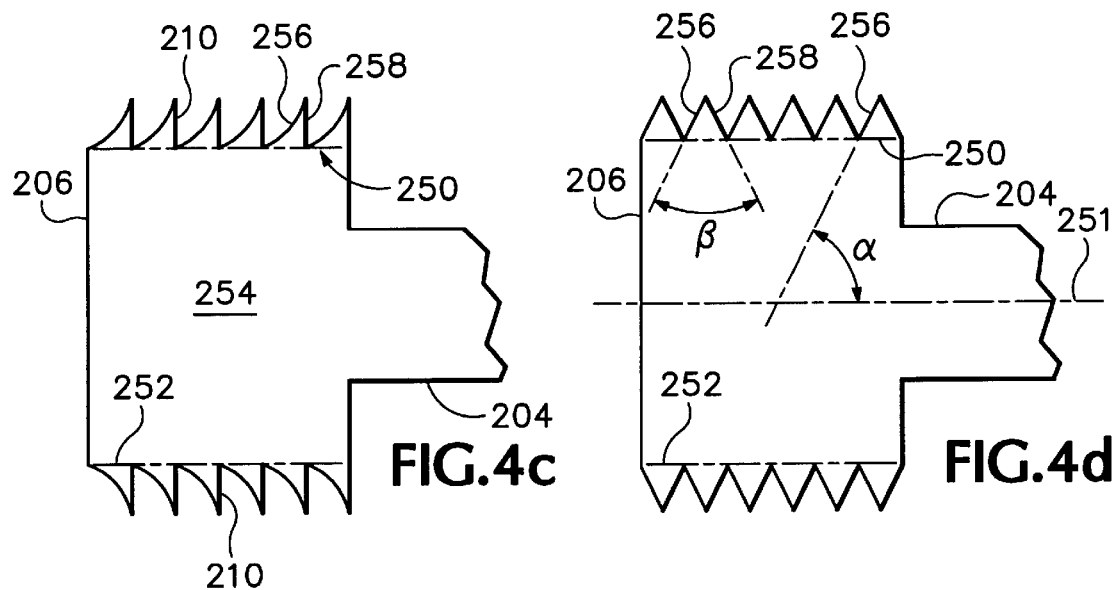
FIG.4c
FIG.4d
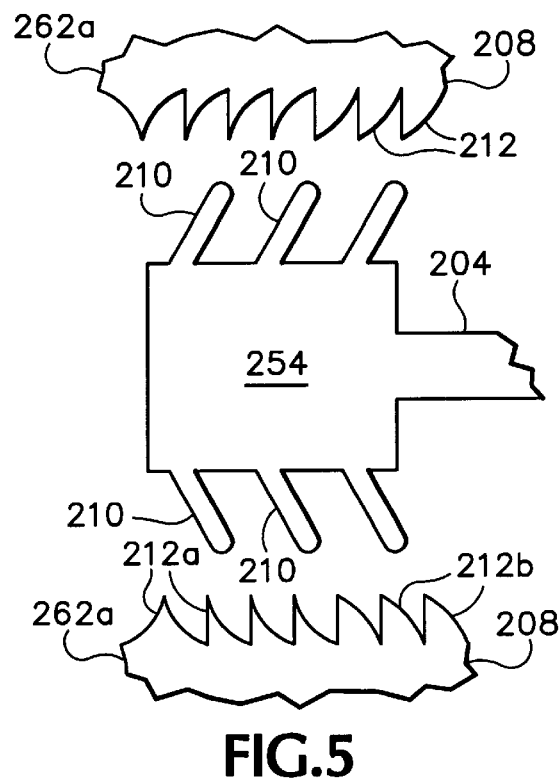
FIG.5

MICROELECTROMECHANICAL SYSTEM ACTUATOR FOR EXTENDED LINEAR MOTION

BACKGROUND OF THE INVENTION

1. Field of the Invention

This invention pertains to the field of microelectromechanical systems (MEMS) actuators.

2. Description of the Related Art

Electrically controlled actuators receive an electrical signal input and provide a mechanical output. The mechanical output provides power (force times displacement, per unit time) that can be used to move objects. Large, electrically controlled actuators are common in mechanical systems to control valves, pumps, switches and otherwise move objects.

Recent innovations require control of very small components that are formed on semiconductor substrates by conventional semiconductor fabrication processes. Groups of such components are known as microelectromechanical systems (MEMS). MEMS borrow design elements from their larger, conventional-size, functional equivalents, but must be adapted to semiconductor fabrication techniques and the dynamic effects of miniature size. An often essential part of MEMS are actuators that provide physical movement or force to other MEMS components in order to operate, or initiate, the MEMS device.

In U.S. Pat. No. 5,808,384 a photolithographic process is used to fabricate a MEMS having an actuator that controls switches, relays, and valves. This actuator consists of a coil and magnetic core to move a member. However, this actuator is capable of only a very small range of motion and is thus limited to particular applications in which a relatively small range of motion is required.

Certain MEMS devices include relatively large planar objects that require a means to position the planar object for operation. In so-called "billboard" applications, a planar object is formed flat against a supporting wafer and must be moved upright for use (i.e., oblique to the wafer)—similar to how a billboard is arranged relative to its supporting ground surface.

U.S. Pat. No. 5,867,297 discloses such a billboard application in relation to a prior art MEMS optical scanner in which a mirror is fabricated in the horizontal plane (i.e., parallel to the wafer upon which the mirror is formed) and then lifted into a substantially vertical arrangement. The 5,867,297 patent states that a comb drive may be used "to facilitate this process" without disclosing how a comb drive could do so.

Electrostatic comb drives use principals of electrical capacitance to provide power to move an object. Electrostatic comb drives are comprised of two comb-shaped portions ("combs") that are arranged so that a set of fingers of one comb is interdigitated with a set of fingers of the other comb. When a voltage is applied across the two combs, a capacitance is created between fingers of the respective combs that creates an attractive force urging the combs to move toward one another.

Comb drives may be linear, such that each comb includes parallel fingers projecting from a straight backbone, or rotary, wherein the fingers project radially from a curvilinear backbone. Inherent disadvantages of comb drives are its small range of motion and the forces generated are small.

In contrast to the motion produced by a comb drive, raising a billboard requires a relatively large range of motion and may require a relatively large force to start the movement or to push the billboard into a jig. Other MEMS devices may also require a large range of motion, including adjustable optical systems that have a large focal length.

Prior art devices that use comb drives to move an object through a large motion must compensate for the comb drive's small range of motion. One method uses two comb drives arranged orthogonal to one another to rotate a round drive wheel of a ratchet mechanism whereby the comb drives provide sequential pulling forces on the drive wheel and a pawl acts on the drive to prevent reverse motion so that the drive wheel rotates in one direction only. The ratchet mechanism is coupled to the object, such as the billboard structure, to raise the object to its desired orientation. Problems with such mechanisms include the large number or moving parts, which creates multiple failure modes and increases fabrication complexity, and the large area on the substrate (a so-called "footprint") that is necessary for the parts. In contrast, ideal MEMS actuators are simple, compact, and easily fabricated.

SUMMARY OF THE INVENTION

The present invention provides a wafer-mounted microelectromechanical systems (MEMS) actuator that receives electrical input and provides a mechanical output having a relatively large range of motion.

A preferred embodiment of a MEMS actuator of the present invention includes a drive mechanism coupled to a pallet, and a drive member that is slideably coupled to a substrate wafer. Operation of the drive mechanism moves the pallet in-and-out of contact with the drive member so as to incrementally move the drive member. Movement of the drive member may be used to move other objects, such as raising a billboard or moving a lens.

In preferred embodiments, the drive mechanism is a comb drive, although other types of drive mechanisms are also suitable.

The drive member includes opposed rows of drive teeth located on inner margins of a channel formed in the drive member. The pallet has opposite edges that each include a row of pallet teeth, and the pallet is located in the channel, between the rows of drive teeth. The pallet and drive member are arranged so that when the drive mechanism moves the pallet, the pallet teeth move into, and out of, engagement with respective rows of drive teeth on the drive member. As explained below, when the pallet teeth move into engagement with the drive teeth, the drive member is moved incrementally. Repeated engagements of the pallet teeth with the drive teeth cause the drive member to move a desired distance. In preferred embodiments, the drive member is elongate and slideably coupled to the substrate and constrained to move along a desired drive axis.

The pallet teeth and the drive teeth are shaped so that the pallet teeth can mesh with the drive teeth. A preferred tooth design is a sawtooth pattern wherein each tooth includes a leading side and a trailing side. As explained in greater detail below, the orientation and arrangement of the respective sides determine a direction of motion, motion increment size, force, and other properties.

The pallet and drive teeth may be shaped to accommodate a particular application. The pallet and drive teeth may be made symmetrical so that the drive member may be driven in two directions, e.g., forward and backward. The pallet and drive teeth may be shaped to provide a greater incremental motion upon each contact or the respective teeth may be shaped to provide less motion per increment, but more force.

The shape of the teeth may be further arranged to provide other advantages as may be desired for a particular application.

In operation, the pallet oscillates between the legs of the drive member so that the pallet teeth push against the drive teeth. When the pallet teeth are aligned with the drive teeth, and the pallet is pushed against the drive member, the teeth simply mesh and the drive member does not move. However, when the pallet teeth are misaligned with the drive teeth, meaning that the respective teeth are not in meshing alignment, and the pallet is pushed against the drive member, the drive member moves, in response to the force from the pallet, until the teeth mesh.

Repeated oscillation of the drive mechanism is necessary to move the pallet into repeated engagement with the drive member so as to incrementally move the drive member through its full range of motion.

The several preferred embodiments of the present invention provide different means for the misalignment of pallet and drive teeth, referred to above. In a first embodiment, the opposing inner margins of the drive member have offset teeth and the pallet teeth on the two pallet margins are aligned with one another. Then, when the pallet contacts a first one of the two inner drive member margins, the pallet teeth and drive teeth are, or become, aligned. But, now the opposing pallet teeth are misaligned with the respective drive teeth of the second inner drive member margin. Then, when the pallet is moved into contact with the second inner margin the desired misalignment is provided so that the drive member must move to allow the pallet teeth and drive teeth of the second inner margin to mesh. When the pallet teeth and the second inner margin teeth are meshed, the respective pallet teeth and the first inner margin teeth are misaligned as desired. The process is repeated until the drive member has moved a desired distance.

In a second embodiment, the drive member drive teeth on the opposing margins are aligned, but the pallet teeth of the opposite margins are offset. The operation of this embodiment is similar to the first embodiment described immediately above. To wit, when a respective set of pallet teeth and drive teeth mesh, the other respective opposite set of pallet teeth and drive teeth are misaligned so that when the pallet is moved so as to urge that other respective set of pallet and drive teeth into contact, the drive member must move under the urging force of the pallet so that the teeth mesh.

In other embodiments, the desired misalignment may be provided by a ratchet and pawl mechanism, a biased dog, or other means that cause the pallet teeth and drive teeth to be misaligned just prior to urging the pallet teeth against the drive teeth.

A prior art method of fabrication of MEMS is a multi-user MEMS process (referred to as MUMPs). In general, the MUMPs process provides up to three-layers of conformal polysilicon that are etched to create a desired physical structure. The first layer, POLY 0, is coupled to a supporting nonconductive wafer. The second and third layers, POLY 1 and POLY 2, are mechanical layers that can be separated from their underlying structure by the use of sacrificial layers that separate the layers during fabrication and are removed near the end of the process. The POLY 1 and POLY 2 layers may also be fixed to the underlying structure (the wafer or lower POLY 0 or POLY 1 layer as the case may be) through openings, or vias, made by etching.

The MUMPs process also provides for a final top layer of 0.5 $\mu$m thick metal for probing, bonding, electrical routing and reflective mirror surfaces.

Further information of the MUMPs process is available from Cronos Microsystems, Inc., 3021 Cornwallis Road, Research Triangle Park, N.C.

In preferred embodiments, the device of the present invention is fabricated by the MUMPs process. However, the MUMPs process may change as dictated by Cronos Microsystems, Inc., or other design considerations. The MUMPs fabrication process is not a part of the present invention and is only one of several processes that can be used to make the present invention.

BRIEF DESCRIPTION OF THE DRAWINGS

FIGS. 3a and 3b are detail views of two preferred embodiments of the pallet and drive member of FIG. 1.

FIGS. 4a, 4b, 4c, and 4d are alternative embodiments of shapes, sizes and arrangements of teeth of the pallet or drive member of the present invention.

FIG. 5 is a top plan view of an alternative embodiment of the present invention in which the pallet teeth are finger-like projections that can meshingly engage plural drive tooth profiles.

DETAILED DESCRIPTION OF THE PREFERRED EMBODIMENTS

Figure 1:
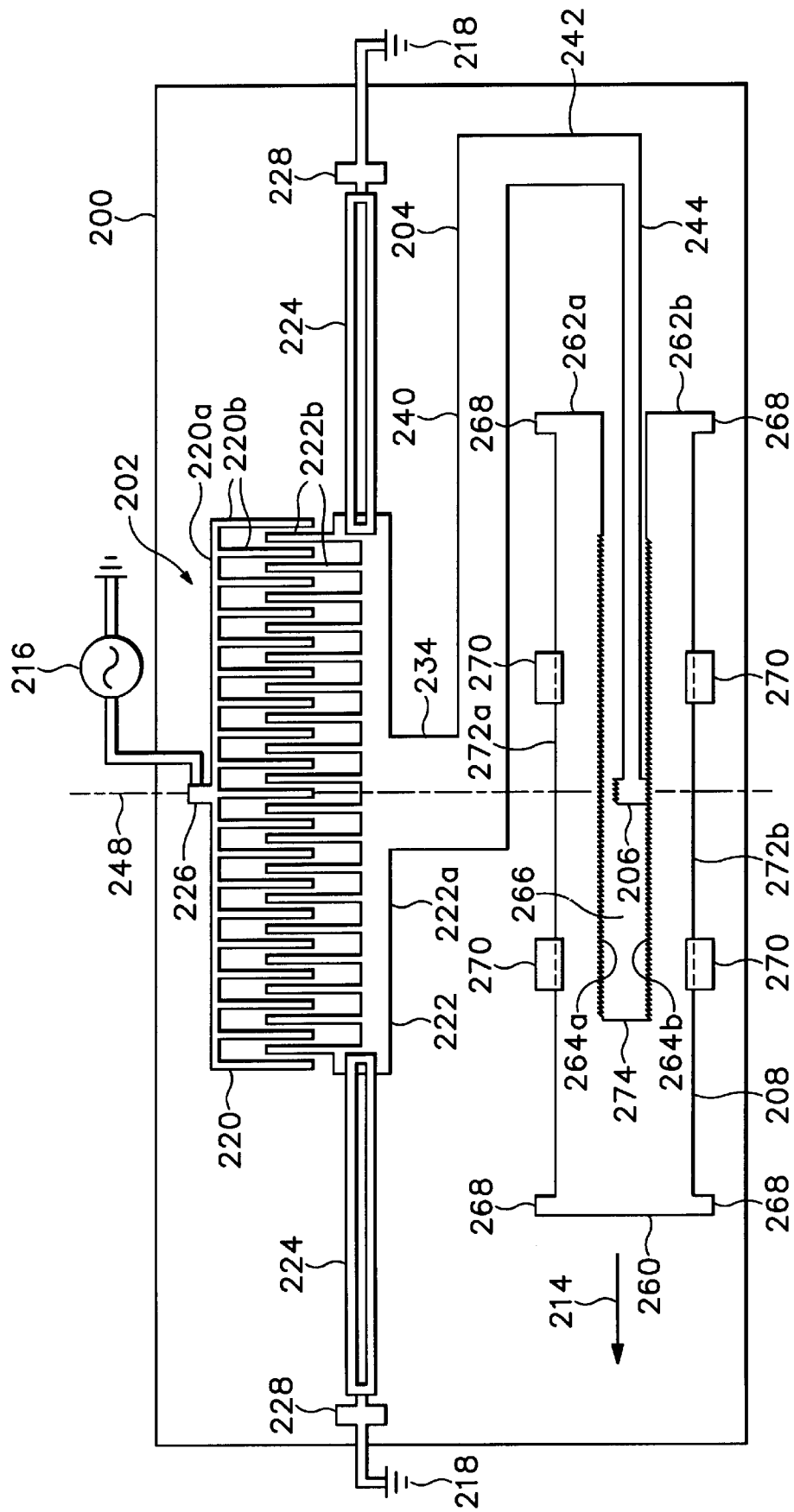
FIG. 1 is a top plan view of a preferred embodiment of a linear actuator having an extended throw of the present invention wherein a comb drive of the actuator is biased into a neutral position by bias members and a pallet is engaged with a first inner margin of a drive member.

With reference to FIGS. 1, 2, 3a, 3b, and 4a, a first preferred embodiment of the present invention is described.

Microelectromechanical systems (MEMS) are mechanical structures having a small feature size that typically perform specialized mechanical functions. The present invention provides an actuator that has a relatively long range of motion, or throw—"throw" being a term of art that refers to the distance the actuator can move an object. The throw of the actuator of the present invention is long relative to the size of the respective micromechanical structures that comprise MEMS.

In summary, the actuator of the present invention is formed on a substrate 200 and includes a comb drive mechanism 202 that is coupled to a drive arm 204 having a pallet 206 connected to a distal end thereof. A drive member 208 is slideably coupled to the substrate and partially envelopes the pallet. A power supply 216 (shown schematically) operates the comb drive to move the drive arm, which in turn moves the pallet so that the pallet cooperates with the drive member to move the drive member along a direction of motion 214.

The pallet moves the drive member 208 by forcefully meshing misaligned teeth on the pallet and the drive member. The pallet includes pallet teeth 210 that engage drive teeth 212 of the drive member 208. When a set of pallet teeth are misaligned with a respective opposing set of drive teeth, as explained below, and those pallet teeth are pushed against the respective drive teeth, the drive member is forced to move incrementally to allow the pallet teeth to mesh with the drive teeth. Repeated forceful meshing of the pallet teeth and drive teeth is necessary to incrementally move the drive member through its preferred range of motion. The actuator and the actuator's operation, are described in greater detail below.

The Drive Mechanism

In preferred embodiments, the drive mechanism is the comb drive 202, which includes a first comb 220 and a second comb 222. Each comb 220, 222 includes a spine 220a and 222a and a plurality of comb fingers 220b and 222b, respectively (only a representative number of fingers are linked to reference numbers). The first comb 220 is fixedly coupled to the substrate 200 whereas the second comb 222 is not fixedly coupled to the substrate, but is held by two bias members 224 that are anchored to pads 228 and that are flexible to permit the second comb to move relative to the first comb and the substrate. In addition, the bias members 224 are electrically conductive and thus provide an electrical connection to the second comb 222 from pads 228. The bias members 224 and the second comb 222 are electrically isolated from the first comb 220 so that a voltage potential difference may be established between the first and second combs to move the second comb.

Exemplarily, the first comb is coupled to the power supply 216 and the pads 228 are electrically coupled to a ground, or other fixed, potential 218.

In addition, the bias members 224 urge the second comb 222 to a neutral position, which is the position of the second comb when no other external forces are applied to the second comb. The neutral position may be arranged such that the second comb and pallet 206 are as shown in FIG. 1, wherein the pallet is engaged with a margin 264b of the drive member. Alternatively, the neutral position may be arranged such that the pallet 206 is engaged with an opposite margin 264a from what is shown, or located between the margins 264a and 264b.

Figure 2:
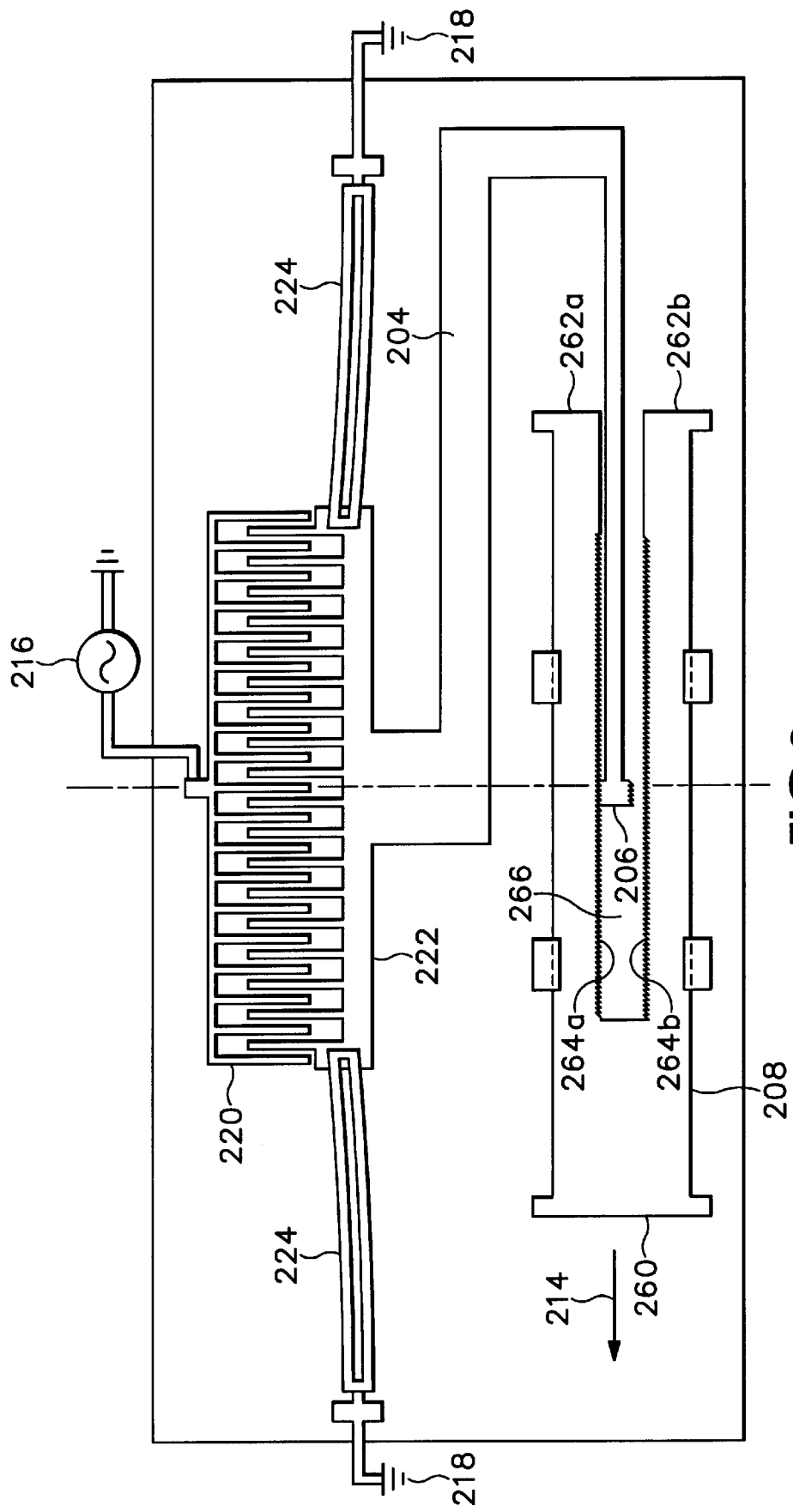
FIG. 2 is a top plan view of the linear actuator of FIG. 1 wherein the actuator is activated showing the comb drive in a state of attraction thereby moving the pallet to engage a second margin of the drive member.

The comb drive is operated by the external power supply 216 that is coupled to a pad 226 that is connected to the first comb. The power supply 216 establishes a voltage potential difference between the first comb and the second comb, which is exemplarily held at ground 218. The potential difference induces a capacitance between fingers 220b and 222b of the respective combs that creates an attractive force urging the second comb toward the first comb, as schematically represented in FIG. 2. So long as the voltage difference is maintained across the first and second combs, the second comb is urged toward the first comb. When the voltage difference is terminated, the capacitive force ceases and the second comb is urged back to the neutral position (shown in FIG. 1) by the bias members 224.

Preferably, the power supply is controlled to provide a time-varying voltage so that the voltage potential across the first and second combs 220, 222 varies over time. The applied voltage may be a sawtooth, sinusoidal, cycloidal, hypocycloidal, or other time-varying waveform.

When a voltage potential exists across the first and second combs, the second comb spine 222a moves closer to the first comb spine 220a, as shown in FIG. 2. When the voltage potential difference between the first and second combs is substantially terminated, the bias members move the second comb into the neutral position, as exemplarily shown in FIG. 1. The application of the time-varying voltage thus oscillates the second comb between the neutral position of FIG. 1 and the induced-capacitance position of FIG. 2.

Alternatively, the drive mechanism may be any prior art mechanism that provides electrically controlled motion, such as heatuators, thermal bimorphs, thermal buckling beams, rotary comb drives, or magnetic bimorphs. The objective of the drive mechanism is to be reliable and inexpensive to fabricate, have a small footprint on the substrate, and controllably drive the pallet as described herein.

The Drive Arm

The drive arm 204 couples the pallet 206 to the second comb 222. Accordingly, as the second comb oscillates, the arm 204 and pallet 206 likewise oscillate in concert. Preferably, the arm is substantially rigid and lightweight to efficiently transfer motion to the pallet 206.

In preferred embodiments, the arm 204 includes a stub portion 234 and a first leg 240 that juts from the stub portion and extends as an elongate member to a cross-member 242. The cross-member 242 extends a short distance to a second leg 244 that is substantially parallel to the first leg 240. The pallet 206 is coupled to a distal end of the second leg and the second leg is sized so as to position the pallet substantially along a bisecting centerline 248 that laterally bisects the comb drive 202. Further, the first and second legs are sized so as to permit the drive member 208 to move its full range of motion without contacting the arm 204.

In preferred embodiments, the arm 204 is formed in unitary construction with the second comb 222 and pallet 206. That is, the second comb 222, arm 204, and pallet 206 are formed as a unitary part during fabrication.

In an alternative embodiment, the arm 204 may extend substantially straight from the second comb 222 and pass beneath, or over, one leg (e.g., leg 262a) of the drive member 208. In this alternative embodiment, the pallet 206 would be formed on, and extend above, or below, a distal end of the arm so as to be located between the drive member margins 264a and 264b.

The Pallet and Pallet Teeth

The pallet teeth 210 are located along first and second lateral edges 250 and 252, respectively, of a pallet body portion 254. The size, shape, and arrangement of the pallet teeth influences the operation of the actuator. Below, a first preferred embodiment is disclosed, and then selected alternative embodiments are disclosed. In addition to the embodiments disclosed in detailed, many alternative embodiments of the pallet and pallet teeth are possible to tailor the actuator's operation to a desired performance.

In a first preferred embedment, shown in FIGS. 3a and 4a, the pallet teeth 210 are right triangles having a base side (not separately numbered) that is integral, and collinear, with a respective lateral edge 250 or 252. Extending from each base side of each tooth is a first side 256 that is oblique to the base side and a second side 258 that is substantially orthogonal to the base side. The first side 256 of the pallet teeth is oriented at an angle a to an axis 251 that is substantially parallel to the direction of travel 214. The value of the angle $\alpha$ is a slope of the teeth and determines the force and incremental movement of the drive member 208 each time the pallet is forced against drive teeth 212 of the drive member. For large values of a (i.e., $\alpha > 45$ degrees), the incremental movement of the drive member will be relatively small each time the pallet is pushed against the drive member, but the force moving the drive member in the direction of motion will be relatively great. Conversely, for smaller values of $\alpha (\alpha < 45$ degrees), the incremental movement of the drive member will be relatively larger and the force in the direction of motion will be relatively smaller.

The pallet 206 is shown with approximately six pallet teeth 210 on each edge 250, 252, but a pallet having more or fewer pallet teeth may also be suitable. The pallet body 254 need not be substantially square, as shown, but may embody other configurations, such as having edges 250, 252 that are semicircular. The pallet body may simply be a portion of the return arm 244 that supports one or more pallet teeth 210.

Preferably, the pallet 206 is located along the centerline 248 so that the pallet mimics the motion of the second comb without introduction of mechanical harmonics to provide system stability. Desirably, the pallet 206 moves so that the pallet contacts the drive margins 264a, 264b squarely—that is, all the pallet teeth engage an equal number of drive teeth simultaneously. Other arrangements might cause malocclusion of the pallet teeth and drive teeth so that some teeth contact before all the teeth contact. Such malocclusion is undesirable.

Additionally, as the pallet contacts the drive teeth 212, the pallet is subjected to a reaction impact force, which force acts on the second comb 222 through the arm 204. Because the pallet is located along the centerline 248, the reaction force is directed along the centerline, as is desirable to reduce forces on the second comb that could skew the second comb relative to the first comb 220. In the prior art of electrostatic comb drives, it is known that first and second combs can become skewed during operation even to the point that the first and second combs jam and the comb drive ceases to function. Accordingly, the present arrangement minimizes forces on the second comb that could skew the second comb relative to the first comb.

The Drive Member and Drive Teeth

Preferably, the drive member 208 is a pi-shaped member having a head 260 and elongate legs 262a and 262b. The head can be used to connect to, or push against, other objects to perform work on those objects as the drive member moves. The legs include inner, opposed margins 264a and 264b, respectively, upon which the drive teeth 212 are located. Between the margins 264a and 264b is a channel 266. Stops 268 are located on the head 260 and legs 262a and 262b to define limits on the range of motion of the drive member.

In the first preferred embodiment, the drive teeth 212 are substantially similar in configuration to the pallet teeth 210, but are arranged in mirror image orientation. Thus, the drive teeth include a base side (not numbered) that is integral with the drive member's inner margins 264a and 264b and a first side 276 that extends obliquely from the base side, and a second side 278 that extends orthogonally from the base side.

The drive member 208 rests on the substrate 200 and is guided and constrained by guides 270. In the preferred embodiments shown, two guides are located along each outer margin 272a and 272b of the drive member 208. However, a greater or fewer number of guides may also be suitable. The guides act to constrain the lateral motion of the drive member so that the drive member moves only along a longitudinal axis collinear with the exemplary direction of motion 214. The guides further act in cooperation with the stops 268 to stop the drive member at the ends of the desired range of motion.

In cross-section elevation, the guides 270 are inverted L-shaped members that extend up from the substrate 200 and over the outer margins 272a and 272b of the drive member. One or more guides may also include a pawl mechanism and the drive member's outer margin 272a or 272b could include a set of ratchet teeth that cooperate with the pawl mechanism to resist backward motion of the drive member. Other guide configurations may also be suitable.

Preferably, the drive teeth 212 extend in a row along the inner margins 264a and 264b. The length of the row of drive teeth minus the length of the pallet is a length of the practical range of motion, or maximum throw, of the actuator. The actual range of motion could extend to the last pallet tooth and thus be substantially equal to the length of the row of drive teeth 212, minus one tooth. In a particular application, the actual throw may be any desired length that is less than the maximum throw.

In FIGS. 1 and 2, the drive member 208 is shown approximately one-half of the distance along its range of motion. During fabrication, the drive member 208 is formed to the right (as viewed in FIGS. 1 and 2) so that a terminal end 274 of the channel 266 is near the pallet 206. Then, when the actuator is operated, the drive member of the present embodiment moves to the left any distance up to the length of the maximum throw. The drive member may not move further after the pallet encounters an end of the drive teeth or the stops 268 encounter a guide 270.

Operation

In operation, a time-varying voltage causes the second comb of the comb drive to oscillate. As the second comb oscillates, so too do the arm 204 and the pallet 206 oscillate. The pallet is moved by the comb drive a sufficient distance so that it can forcefully move between the inner margins 264a and 264b of the drive member 208 and forcefully contact the drive teeth 212.

As the pallet oscillates, the pallet alternates between contact with the inner margins 264a and 264b. When the pallet is urged into contact with an inner margin, the pallet teeth 210 are urged into meshing engagement with the drive teeth 212.

If the pallet teeth and the drive teeth are in meshing alignment when the pallet is urged into contact with the respective drive margin, the pallet teeth meshingly engage the drive teeth with no effect on the drive member. However, when the pallet teeth and the drive teeth are not in meshing alignment, but rather are misaligned when the pallet teeth are urged against the drive teeth, the drive member 208 must move under the force of impact between the pallet teeth and the drive teeth in order that the teeth may enter into meshing engagement.

Meshing alignment refers to an alignment of respective pallet teeth 210 and drive teeth 212 wherein the pallet can enter into meshing engagement with the drive teeth without movement of the drive member. Meshing misalignment refers to an alignment of respective pallet teeth and drive teeth wherein the pallet can not meshingly engage the drive teeth without movement of the drive member.

Meshing engagement of the pallet teeth and the drive teeth means that the respective teeth are engaged and seated. Thus, the pallet teeth are meshed with the drive teeth when the pallet teeth are in contact with, and seated, against, the drive teeth. The pallet teeth are seated against the drive teeth when the respective pallet edge 250a (or 252) is as close to a respective drive margin 264a (or 264b) as possible without deformation of the system components. However, the pallet teeth need not be fully seated in order to move the drive member.

Being out of meshing engagement refers to a state wherein the pallet teeth are not seated against the drive teeth (although the pallet teeth may be in contact with the drive teeth).

As stated, the pallet oscillates so as to move alternately in and out of contact with the drive member margins 264a and 264b to incrementally move the drive member. Incremental movement occurs when the pallet teeth 210 are pushed against misaligned drive teeth 212. Thus in preferred embodiments, when the pallet teeth of one edge are meshingly engaged with, for example, the drive teeth of margin 264a, the opposite pallet teeth are misaligned with the drive teeth of margin 264b, and vice versa. In this manner, the pallet can oscillate between the drive teeth of the margins 264a and 264b and be misaligned with the respective teeth of the margin to which the pallet teeth are being urged against. Each time that the pallet teeth are urged against the drive teeth and the respective teeth are not in meshing alignment, the drive member moves incrementally forward, exemplarily in the direction of motion 214.

This pattern of alternating misalignment may be provided in several ways. In the preferred embodiments, this alternating misalignment is provided by offsetting one row of drive teeth 212 from the other row of drive teeth 212, as shown in FIG. 3a, or by offsetting one row of pallet teeth 210 from the other row of pallet teeth 210, as shown in FIG. 3b.

In FIG. 3a, the drive teeth 212 along inner margin 264a are offset from the drive teeth 212 along inner margin 264b. That is, with respect to a reference axis 280, a second side 278 of one drive tooth on inner margin 264a is aligned with the reference axis 280, while on the opposing set of teeth on inner margin 264b the reference axis 280 passes through an oblique first side 276 of a drive tooth. The pallet teeth on the opposite lateral edges 250 and 252 are substantially aligned with one another. By this arrangement, both respective sets of facing teeth can not both be in meshing alignment simultaneously. That is, the pallet teeth 210 on pallet edge 250 and the facing drive teeth on inner margin 264a cannot be in meshing alignment at the same time as the pallet teeth on pallet edge 252 and the drive teeth on inner margin 264b.

In FIG. 3a, the pallet teeth 210 on pallet edge 250 are misaligned with the drive teeth 212 on inner margin 264a, and the pallet teeth on pallet edge 252 are substantially aligned with the drive teeth on inner margin 264b. Thus, at the point in time shown in FIG. 3a, moving the pallet 206 upward in the direction of arrow 282 to push against the inner margin 264a will incrementally move the drive member forward along the direction of motion 214.

After the pallet moves as indicated in FIG. 3a, so that the pallet teeth on pallet edge 250 meshingly engage the drive teeth of inner margin 264a, the drive member has moved to accommodate the force of impact with the pallet. At that point, the pallet teeth on pallet edge 252 are not in meshing alignment with the drive teeth on inner margin 264b. Thus, the respective teeth on the pallet and drive member are properly arranged to have the pallet move downward, opposite arrow 282, so that the pallet teeth on pallet edge 252 push against the drive teeth on inner margin 264b while they are not in meshing alignment, thus forcing the drive member to move incrementally forward along direction 214. This operation is repeated by oscillating the pallet back and forth between the drive member margins 264a and 264b so as to incrementally move the drive member a desired distance.

In an alternative embodiment, shown in FIG. 3b, the rows of pallet teeth 210 are offset from one another. Thus, with respect to a reference axis 284 the pallet teeth along the pallet edge 250 are offset from the pallet teeth along pallet edge 252. Also, in this embodiment, the row of drive teeth on inner margin 264a are aligned with the drive teeth on inner margin 264b. Accordingly, the pallet teeth on edge 250 and the drive teeth on inner margin 264a cannot be in meshing engagement at the same time as the pallet teeth on pallet edge 252 and the drive teeth on inner margin 264b.

In yet another embodiment, the misalignment of the respective rows of pallet teeth and drive teeth need not be symmetrical. That is, when the pallet teeth on pallet edge 250 are meshingly engaged with the drive teeth of margin 264a then the opposite sets of teeth on pallet edge 252 and margin 264b are misaligned by an amount δ. And, when the pallet teeth on edge 252 are meshingly engaged with margin 264b, the opposite sets of teeth on pallet edge 250 and margin 264a are misaligned by an amount δ'. When such non-symmetrical misalignment is combined with a different tooth profiles on the respective sets of pallet and drive teeth, the actuator can be tailored to specific applications to provide a desired force v. motion performance.

Additional Alternative Embodiments

Alternative embodiments for the pallet teeth are shown in FIGS. 4b, 4c, 4d, and 5. In FIG. 4b that pallet teeth 210 are substantially involute, having a profile similar to involute gear teeth. The actual tooth profile may be adjusted to achieve a desired load-deflection response.

In FIG. 4c, the pallet teeth 210 are substantially parabolic. This embodiment is suitable for providing higher forces at the onset of pallet contact with the drive member teeth in order to overcome stiction of the drive member, or the object being manipulated, as may be needed.

In the embodiment of FIG. 4d, the pallet teeth are substantially sawtooth in shape. This embodiment is suitable for bi-directional motion, in which the drive member can be driven forward as indicated by direction 214, or backward, opposite the direction 214. In this embodiment, the first and second sides 256, 258 of the teeth 210 are oblique to the axis 251. The first side 256 is arranged at the angle α to the axis 251, and the first and second sides form an angle β. The angles α and β may be selected to control the incremental movement of the drive member in the forward and backward directions. Additionally, as stated above in connection with the operation of the first embodiment, changing the angle α affects the incremental motion and the force that can be transmitted to objects to do work. To have forward motion, α must be less than 90 degrees. Angle β may be selected so that the backward motion has the same displacement and force characteristics as forward motion, or β may be selected to provide different. displacement and force characteristics.

The direction of motion of the drive member can be reversed by controlling the amount of movement of the pallet. Exemplarily, when the pallet is pushed against a margin (e.g., 264a) of the drive member until the drive member moves and the respective pallet teeth and drive teeth mesh, the drive member moves a distance $X_1$ in direction 214, and the pallet has moved a distance $Y_1$ from a longitudinal centerline of the channel 266. The opposite set of pallet and drive teeth are now misaligned as desired so that moving the pallet a distance $Y_1$ from the channel centerline (in an opposite direction) to push against the opposite drive member margin (viz. 264b), again moves the drive member a distance $X_1$ in direction 214.

However, if the pallet were moved a distance $Y_2$ that is less than $Y_1$ so that pallet pushes against the drive teeth, but does not move the drive member a full distance $X_1$, then the misalignment of the opposite pallet edge and drive margin is different than above. With proper arrangement of the geometry of the pallet teeth and drive teeth, and moving the drive member a proper distance (less than $X_1$), the pallet teeth and drive teeth are now indexed for backward movement. Now, when the pallet is moved a distance $Y_1$ so that the pallet pushes against the differently misaligned drive margin, the drive member is pushed backward, opposite direction 214. After having been so indexed, the comb drive may resume normal operation to fully oscillate the pallet back and forth to push against alternate drive margins 264a and 264b to incrementally move the drive member a desired distance backward.

If so desired, the comb drive may again be operated for a partial movement of the pallet, again, a distance $Y_2$ (less than $Y_1$), so that the pallet and drive teeth are indexed for movement in the direction 214.

Another embodiment is shown in FIG. 5. The pallet teeth 210 are finger-like projections having rounded distal ends that push against drive teeth 212. The pallet teeth of this embodiment are particularly suitable for meshing with various drive teeth profiles. Thus, the drive teeth 212 may have a tooth profile similar to the exemplary pallet tooth profiles shown in FIGS. 4a, 4b, 4c, or 4d, or other tooth profiles, and the finger-like pallet teeth of FIG. 5 can suitably mesh with such drive tooth profiles and drive the drive member 208.

In FIG. 5, the drive teeth are shown having two exemplary different profiles at 212a and 212b. Both tooth profiles may be driven by the finger-like pallet teeth 210 of this embodiment. The drive teeth having the profile at 212a, in combination with the finger-like pallet teeth 210, can provide a desired force/displacement response. The drive teeth at 212a have a steep initial slope and a relatively flat terminal slope. Accordingly, as the pallet teeth begin to push against drive teeth at 212a, impact forces of the pallet teeth contacting the drive teeth will be resisted by a reaction force at the drive teeth that will be substantially normal to the surface of the drive tooth at the point of contact with the pallet tooth. Because the slope is steep near the point of initial contact, the reaction force will be oriented in the direction of travel, thus providing a relatively large force to move the drive member 208. However, because the drive tooth slope is steep, the pallet must move relatively further along its transverse direction in order to substantially move the drive member.

This relationship is most clearly evident in an exemplary embodiment (not shown in connection with this embodiment of the pallet teeth) of drive teeth that have a 45 degree angle sloop relative to the direction of motion of the pallet, such as the tooth profile of the pallet teeth of FIG. 4a. In such an exemplary embodiment, for a distance of motion $Y_3$ of the pallet, when the pallet is pushing against the drive teeth, the drive member must move a distance $X_1$ along the drive path 214.

In this exemplary embodiment in which the drive teeth have a 45 degree sloop relative to the direction of travel of the pallet, then $X_1=Y_3$. However, where the drive tooth sloop is greater than 45 degrees (i.e., α>45 degrees, relating drive teeth configuration to the discussion of pallet teeth in FIG. 4a), then when the pallet moves a distance $Y_3$, the drive member will move a smaller distance $X_2$, such that $Y_3>X_2$. By the same analysis, if the drive tooth slope is less than 45 degrees (α<45), then $Y_3<X$.

Thus, for a steep drive tooth slope (α>45 degrees), the drive member will move little relative to the distance moved by the pallet when the pallet teeth slide along the drive teeth. Conversely, for a swallow drive tooth slope (α<45 degrees), the drive member will move greater relative to the distance moved by the pallet when the pallet teeth slide along the drive teeth.

Thus, returning to the tooth profile 212a of FIG. 5, the initial steep slope of the drive teeth of 212a provides a high force to move the drive member in the direction of drive path 214, but a small movement distance. This tooth profile is useful to provide a large force that may be necessary to overcome stiction or other forces associated with initial movement of the drive member.

Less steep tooth profiles may be used to provide greater, or faster, movement, such as exemplified by the tooth profiles at 212b, of FIG. 5. Other tooth profiles may provide optimum performance in particular circumstances.

In the embodiment of FIG. 5, the finger-like pallet teeth 210 are biased rearward so that the drive teeth may have a more shallow initial slope. Thus, drive teeth may be designed to provide greater movement of the drive member 208 for each push from the pallet.

In the embodiment of FIG. 5, the pallet teeth 210 must have a length and spacing to accommodate the drive teeth. Fewer of greater numbers of pallet teeth may be included. Some applications may achieve optimum performance with a single pallet tooth 210 on each margin of the pallet. The pallet teeth need not be rearward biased.

Other pallet tooth shapes, sizes, and arrangements are within the scope of the invention. As stated, movement of the drive member occurs when pallet teeth are pushed against misaligned drive teeth. The force of the pallet teeth pushing against the drive teeth causes the drive member to move until the pallet teeth and the drive teeth are in meshing engagement. Thus, the only restriction on the shape do the drive teeth is that they can be misaligned with the pallet teeth and when pallet teeth are pushed against misaligned drive teeth, the drive member moves until the teeth are meshingly engaged.

In preferred embodiments, the drive teeth are substantially similar to the pallet teeth, but arranged in mirror image fashion, as described in connection with the first embodiment above. However, in alternative embodiments, the drive teeth may differ from the pallet teeth. In particular, the drive teeth may be frustums of the shape of the pallet teeth, or the pallet teeth may be frustums of the shape of the drive teeth.

In alternative embodiments, the drive mechanism may be driven along a non-linear drive path. The drive member may be in the shape of an arc and constrained to move circumferentially about a center point.

Figure 6:
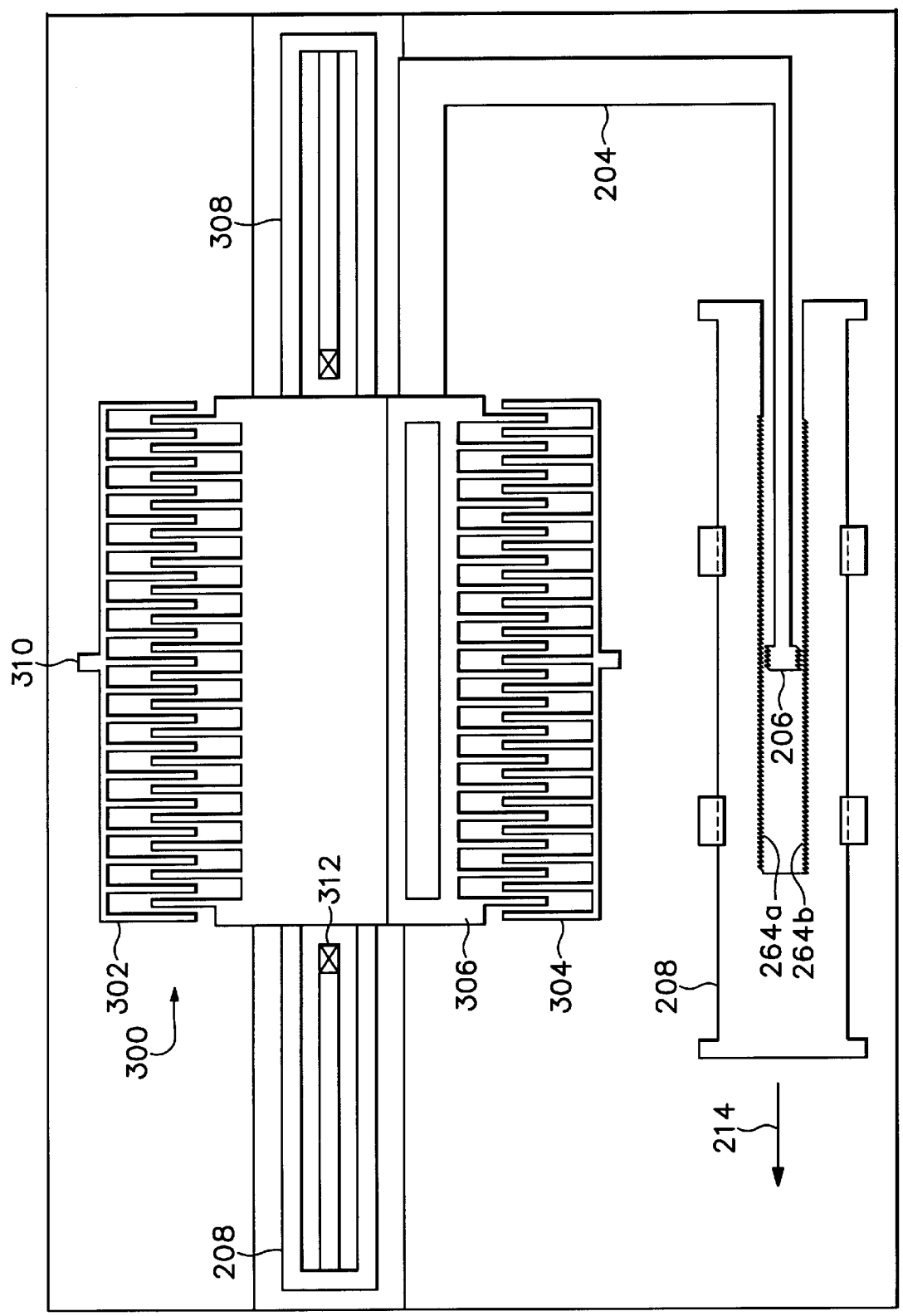
FIG. 6 is an alternative embodiment of the present invention wherein a drive mechanism include two comb drives.

With reference to FIG. 6, an alternative embodiment of the drive mechanism is explained. This embodiment has many similarities to the embodiment of FIGS. 1 and 2 such as the drive member 208, the pallet 206 and the drive arm 204. Also, as in the previous embodiment, the drive arm 204 is connected to a drive mechanism 300.

However, in this embodiment the drive mechanism 300 includes two comb drives 302 and 304. The arm 204 is coupled to a frame/mass 306 that is coupled to respective movable comb portions of the comb drives 302, 304. Folded beam springs 308 hold the frame 306 in a neutral position. The springs 308 of this embodiment, perform similarly to the bias members 224 of the embodiment of FIGS. 1 in 2. Accordingly, the beam springs 308 deflect when the frame 306 is subjected to forces from the comb drives 302 and 304, and urge the frame back to its neutral position when the comb drives do not exert force on the frame.

Each comb drive 302, 304 includes an electrically conductive pad 310 that can be coupled to a power supply for driving each respective comb drive. The beam springs 308 each include an anchor 312 that is structurally and electrically coupled to the substrate 314. The beam springs 308, and their respective anchors 312 are located in a region 316 of the substrate 314 that is electrically isolated from the pads 310 so that the fixed portions of the comb drives can be held at a different electrical potential than the frame and the beam springs.

The operation of the comb drives 302 and 304 in this embodiment, is substantially the same as the operation of the comb drive 202 in the embodiment of FIGS. 1 and 2. Accordingly, time varying voltages are applied to the respective pads of comb drives 302, 304 while the frame 306 is maintained at a different, fixed voltage potential. The voltage supplied to the respective comb drives may originate from different voltage sources or the same voltage source controlled to provided voltage to one, or the other, comb drive. Alternatively, the voltage provided to one comb drive may simply be an inverted waveform of the voltage provided to the other comb drive.

Preferably, when the frame 306 is in its neutral position, the pallet 206 is located approximately equidistant from the drive member inner margins 264a and 264b, substantially as the shown in FIG. 6. Thus, when the upper comb drive 302 is activated so as to move the frame 306 upward, the pallet 206 moves upward and pushes against the upper, inner margin 264a of the drive member. When the lower comb drive 304 is activated, moving the frame downward, the pallet moves downward and pushes against the lower, inner margin 264b of the drive member. When neither comb drive is activated to move the frame, the beam springs return the frame to the neutral position and the pallet to the center of the channel 266.

This embodiment may be arranged to provide bi-directional motion, that is, motion forward in the direction 214, or backward, opposite the direction 214. This embodiment may also be used to provide forward motion only, wherein the use of two comb drives increases the force that can be exerted by the drive member.

With reference to fabrication of the present invention, several options are available. Only the first comb 220 and the guides 270 are fixed to the substrate. The first comb may be formed by the POLY 1 layer though openings formed by the ANCHOR 1 etch so that the first comb is anchored to the nitride layer. In the embodiment of FIGS. 1 and 2, the guides must be formed after the drive member 208 is formed so that portions of the guides may be formed over the drive member. Thus, the guides are preferably formed by the POLY 2 layer through openings created by the ANCHOR 2 etch that etches through the POLY 1 layer and the sacrificial layers.

The second comb 222, drive arm 204, pallet 206, and drive member 208 must be free to move relative to the substrate 200. Preferably, these components are formed by the POLY 1 layer on top of the first sacrificial layer. After removal of the sacrificial layer, these components will rest on the nitride layer and be free to move relative to the nitride layer.

The contact pads 226 and 228 may be formed by the POLY 0 layer and provided with a metal layer to ensure good conductivity. The portions that couple to the contact pads, the first comb 220 and the bias members 224, may be formed by the POLY 1 layer and arranged so as to overlie portions of the contact pads to create an electrical path.

This specification sets forth the best mode for carrying out the invention as known at the time of filing the patent application and provides sufficient information to enable a person skilled in the art to make and use the invention. The specification further describes preferred materials, shapes, configurations and arrangements of parts for making and using the invention. However, it is intended that the scope of the invention shall be limited only by the language of the claims and the law of the land as pertains to valid U.S. patents.

What is claimed is:

1. A microelectromechanical system actuator, comprising:
   a substrate;
   a drive mechanism that provides activated motion in a first direction;
   a drive member slideably coupled to the substrate, the drive member including opposed substantially-linear first and second rows of drive teeth, a head portion, and first and second leg portions that extend from the head portion, the leg portions defining therebetween a channel that is open at an end opposite the head portion and wherein the drive member includes a first margin and a second margin that are located in the channel and on the first and second leg portions, respectively, and wherein the first row of drive teeth are located along the first margin and the second row of drive teeth are located along the second margin;
   a pallet coupled to the drive mechanism for movement therewith and including opposed plural first and second pallet teeth that are meshingly engagable with the respective first and second rows of drive teeth, the pallet being coupled to the drive mechanism by an extension that extends through the open end of the channel; and
   a bias member that biases the pallet opposite the first direction so that the plural first pallet teeth meshingly engage the first row of drive teeth when the drive mechanism is not activated,
   wherein activation of the drive mechanism moves the pallet in the first direction so that the plural second pallet teeth meshingly engage the second row of drive teeth, thereby to move the drive member in translation along a linear drive path.

2. The microelectromechanical system actuator of claim 1 wherein the first row of drive teeth are offset from the second row of drive teeth.

3. The microelectromechanical system actuator of claim 1 wherein the plural first pallet teeth are offset from the plural second pallet teeth.

4. The microelectromechanical system actuator of claim 1 wherein the pallet teeth and the drive teeth are substantially triangular in profile.

5. The microelectromechanical system actuator of claim 1 wherein the pallet teeth are elongate projections and the drive teeth are substantially triangular in profile.

6. The microelectromechanical system actuator of claim 1 wherein the pallet teeth are finger-like elongate projections.

7. The microelectromechanical system actuator of claim 6 wherein the drive teeth have a first profile along a first length and a second profile along a second length.

8. The microelectromechanical system actuator of claim 1, wherein the drive mechanism is a comb drive having a first portion fixedly coupled to the substrate and a second portion that is moveable relative to the substrate and the first portion.

9. The microelectromechanical system actuator of claim 8 wherein a laterally-bisecting centerline passes through the second portion of the comb drive and the pallet is located along the centerline.

10. The microelectromechanical system actuator of claim 9 wherein the second portion of the comb drive translates along an axis that is substantially parallel to the centerline and the linear drive path is substantially orthogonal to the centerline.

11. The microelectromechanical system actuator of claim 1 wherein the drive mechanism provides activated motion in only the first direction.

12. The microelectromechanical system actuator of claim 1 wherein the bias member is passive and provides the bias as a static flexure.

13. The microelectromechanical system actuator of claim 1 wherein the bias member includes an opposed pair of elongate flexible arms that are anchored to the substrate at opposite ends.

14. A microelectromechanical system actuator having a substrate and a drive mechanism located on the substrate, comprising:
   a drive arm coupled to the drive mechanism wherein the drive mechanism operates to move the drive arm in a first direction when the drive mechanism is activated;

a pallet coupled to the drive arm for movement therewith, the pallet including a body having a first pallet edge that includes pallet teeth thereon;

a drive member that is slideably coupled to the substrate, the drive member including a first drive margin having thereon drive teeth that are meshingly engagable with the pallet teeth, and spaced-apart first and second leg portions that define a channel therebetween, and the first drive margin is located on the first leg portion, and a second drive margin having drive teeth thereon is located on the second leg portion; and a bias member coupled to the substrate and the drive arm to bias the drive arm in a direction opposite the first direction to meshingly engage the drive teeth and the pallet teeth to move the drive member along a linear drive path, and wherein the bias member yields to permit the drive arm to move in the first direction when the drive mechanism is activated to disengage the drive teeth and the pallet teeth.

15. The microelectromechanical system actuator of claim 14, wherein the pallet teeth are triangular.

16. The microelectromechanical system actuator of claim 14, wherein the pallet teeth are involute.

17. The microelectromechanical system actuator of claim 14, wherein the pallet teeth are parabolic.

18. The microelectromechanical system actuator of claim 14, wherein the pallet teeth are elongate members.

19. The microelectromechanical system actuator of claim 14, wherein the pallet teeth are elongate members that have a longitudinal axis that is substantially orthogonal to the first pallet edge.

20. The microelectromechanical system actuator of claim 14, wherein the pallet teeth are elongate members that have a longitudinal axis that is substantially oblique to the first pallet edge.

21. The microelectromechanical system actuator of claim 14, wherein the drive mechanism is a comb drive.

22. The microelectromechanical system actuator of claim 14 wherein moving the pallet teeth into engagement with the drive teeth comprises moving the pallet along an axis that is substantially orthogonal to the linear drive path.

23. The microelectromechanical system actuator of claim 14, wherein the pallet teeth are misaligned with the drive teeth when the pallet teeth are urged into engagement with the drive teeth and the drive member moves along the drive path until the pallet teeth and drive teeth are aligned.

24. The microelectromechanical system actuator of claim 14 wherein the pallet includes a second pallet edge having pallet teeth thereon and the first pallet edge is oriented toward the first drive margin and the second pallet edge is oriented toward the second drive margin, and the drive mechanism is operated to move the pallet alternatingly between the drive margins so that the pallet teeth of the first pallet edge are moved into engagement with the drive teeth of the first drive margin and the pallet teeth of the second pallet edge are moved into engagement with the second drive margin so that the drive member is incrementally moved along the linear drive path.

25. The microelectromechanical system actuator of claim 14 wherein the drive teeth on the first drive margin are offset from the drive teeth on the second drive margin.

26. The microelectromechanical system actuator of claim 14 wherein the pallet further includes pallet teeth along a second pallet edge that is opposite the first pallet edge and wherein the pallet teeth on the first pallet edge are offset from the pallet teeth on the second pallet edge.

27. The microelectromechanical system actuator of claim 14 wherein the drive mechanism includes first and second comb drives that forcefully move the drive arm only in the first direction.

28. The microelectromechanical system actuator of claim 14 wherein the bias member is passive and provides the bias as a static flexure.

29. The microelectromechanical system actuator of claim 14 wherein the bias member includes an opposed pair of elongate flexible arms that are anchored to the substrate at opposite ends.

30. A microelectromechanical system actuator, comprising:

a substrate;

a drive mechanism that provides activated motion in a first direction;

a drive member slideably coupled to the substrate, the drive member including opposed substantially-linear first and second rows of drive teeth;

a pallet coupled to the drive mechanism for movement therewith and including opposed plural first and second pallet teeth that are meshingly engagable with the respective first and second rows of drive teeth; and a bias member that biases the pallet opposite the first direction so that the plural first pallet teeth meshingly engage the first row of drive teeth when the drive mechanism is not activated, the bias member being passive and providing the bias as a static flexure, wherein activation of the drive mechanism moves the pallet in the first direction so that the plural second pallet teeth meshingly engage the second row of drive teeth, thereby to move the drive member in translation along a linear drive path.

31. The microelectromechanical system actuator of claim 30 wherein the bias member includes an opposed pair of elongate flexible arms that are anchored to the substrate at opposite ends.

32. A microelectromechanical system actuator having a substrate and a drive mechanism located on the substrate, comprising:

a drive arm coupled to the drive mechanism wherein the drive mechanism operates to move the drive arm in a first direction when the drive mechanism is activated;

a pallet coupled to the drive arm for movement therewith, the pallet including a body having a first pallet edge that includes pallet teeth thereon;

a drive member that is slideably coupled to the substrate, the drive member including a first drive margin having thereon drive teeth that are meshingly engagable with the pallet teeth; and a bias member coupled to the substrate and the drive arm to bias the drive arm in a direction opposite the first direction to meshingly engage the drive teeth and the pallet teeth to move the drive member along a linear drive path, and wherein the bias member yields to permit the drive arm to move in the first direction when the drive mechanism is activated to disengage the drive teeth and the pallet teeth, the bias member being passive and providing the bias as a static flexure.

33. The microelectromechanical system actuator of claim 32 wherein the bias member includes an opposed pair of elongate flexible arms that are anchored to the substrate at opposite ends.

34. A microelectromechanical system actuator having a substrate and a drive mechanism located on the substrate, comprising:

a drive arm coupled to the drive mechanism wherein the drive mechanism operates to move the drive arm in only a first direction when the drive mechanism is activated;

a pallet coupled to the drive arm for movement therewith, the pallet including a body having a first pallet edge that includes pallet teeth thereon;

a drive member that is slideably coupled to the substrate, the drive member including a first drive margin having thereon drive teeth that are meshingly engagable with the pallet teeth, and spaced-apart first and second leg portions that define a channel therebetween, and the first drive margin is located on the first leg portion, and a second drive margin having drive teeth thereon is located on the second leg portion; and a bias member coupled to the substrate and the drive arm to bias the drive arm in a direction opposite the first direction to disengage the drive teeth and the pallet teeth, and wherein the bias member yields to permit the drive arm to move in the first direction when the drive mechanism is activated to meshingly engage the drive teeth and the pallet teeth to move the drive member along a linear drive path.

35. The microelectromechanical system actuator of claim 34 wherein the bias member is passive and provides the bias as a static flexure.

36. The microelectromechanical system actuator of claim 34 wherein the bias member includes an opposed pair of elongate flexible arms that are anchored to the substrate at opposite ends.

37. A microelectromechanical system actuator having a substrate and a drive mechanism located on the substrate, comprising:

a drive arm coupled to the drive mechanism wherein the drive mechanism operates to move the drive arm in only a first direction when the drive mechanism is activated;

a pallet coupled to the drive arm for movement therewith, the pallet including a body having a first pallet edge that includes pallet teeth thereon;

a drive member that is slideably coupled to the substrate, the drive member including a first drive margin having thereon drive teeth that are meshingly engagable with the pallet teeth; and a bias member coupled to the substrate and the drive arm to bias the drive arm in a direction opposite the first direction to disengage the drive teeth and the pallet teeth, and wherein the bias member yields to permit the drive arm to move in the first direction when the drive mechanism is activated to meshingly engage the drive teeth and the pallet teeth to move the drive member along a linear drive path, the bias member being passive and providing the bias as a static flexure.

38. The microelectromechanical system actuator of claim 37 wherein the bias member includes an opposed pair of elongate flexible arms that are anchored to the substrate at opposite ends.

* * * * *